United States Patent [19]

Stribling

[11] Patent Number: 4,789,829
[45] Date of Patent: Dec. 6, 1988

[54] METHOD AND APPARATUS FOR DETERMINING RE GASKET SHIELDING EFFECTIVENESS

[75] Inventor: Donald Stribling, Colorado Springs, Colo.

[73] Assignee: Science Application International Corporation, La Jolla, Calif.

[21] Appl. No.: 886,723

[22] Filed: Jul. 18, 1986

[51] Int. Cl.$^4$ .................. G01N 27/82; G01R 27/14
[52] U.S. Cl. .................................. 324/263; 324/62; 324/65 P
[58] Field of Search ............... 324/263, 207, 233, 234, 324/237, 240, 559, 62, 62 P, 64, 65 P, 65 R, 530, 529

[56] References Cited

U.S. PATENT DOCUMENTS

| | | | |
|---|---|---|---|
| 2,479,219 | 9/1949 | Drake | 324/263 |
| 3,454,869 | 7/1969 | Strauss | 324/234 |
| 4,061,965 | 12/1977 | Nelson | 324/559 |
| 4,087,749 | 5/1978 | McCormack | 324/263 |
| 4,445,085 | 4/1984 | Metcalf | 324/529 |
| 4,546,310 | 10/1985 | Chatanier | 324/65 P |
| 4,683,419 | 7/1987 | Neuelmann | 324/263 |

FOREIGN PATENT DOCUMENTS

| | | | |
|---|---|---|---|
| 630038 | 5/1936 | Fed. Rep. of Germany | 324/263 |
| 910496 | 11/1962 | United Kingdom | 324/263 |

Primary Examiner—Reinhard J. Eisenzopf
Assistant Examiner—Jose M. Solis
Attorney, Agent, or Firm—Burns, Doane, Swecker & Mathis

[57] ABSTRACT

A method and apparatus for determining the shielding effectiveness of an RF gasket installed between two mating metallic surfaces of equipment or a structure by creating a time varying current flow from one of the mating surfaces to the other across the RF gasket, and sensing the current density of the time varying current in the vicinity of the gasket as a measure of shielding effectiveness. Two spaced electrodes, in the form of circular metal discs with a layer of dielectric material, are placed adjacent and substantially parallel to respective ones of the two metallic surfaces mated by the RF gasket with the gasket lying in the space between the electrodes. The electrodes are arranged to capacitively create a time varying current flow in the mating metallic surfaces between the electrodes. The current density in the metallic surfaces is sensed at a fixed position between the electrodes as a measure of gasket shielding effectiveness. The current density signal from the probe preferably is amplified and digitized so it can be stored and supplied directly to a computer. The current probe output can be calibrated in a laboratory against gaskets of know shielding effectiveness so as to provide a direct measure of gasket shielding effectiveness.

12 Claims, 2 Drawing Sheets

METHOD AND APPARATUS FOR DETERMINING RE GASKET SHIELDING EFFECTIVENESS

BACKGROUND OF THE INVENTION

The present invention relates to determining, in situ, the radio frequency (RF) shielding effectiveness of gaskets installed in equipment and structures.

Various types of gaskets are used between mating surfaces in electronic equipment and in structures to shield the interior of the equipment or structure against external RF radiation and/or to prevent leakage of RF radiation from the interior of the structure or equipment. The shielding effectiveness of a particular gasket can be measured in the controlled environment of a laboratory in a variety of ways. For example, an RF source may be placed inside an enclosure sealed by the gasket under test and an RF field meter on the outside of the enclosure may measure the amount of RF energy transmitted through the joint or mating surfaces containing the gasket. Similarly, a parallel strip line may be placed on each side of a structure containing the gasket with one strip line acting as an RF transmitter and the other acting as an RF detector.

After an RF gasket has been installed in equipment however, there is no simple test which can be run to determine the shielding effectiveness provided by the gasket. The expected effectiveness may be known from laboratory tests run on the type of gasket used for a particular application before the gasket is installed. However, it will be appreciated that the shielding effectiveness of a gasket degrades over the life of the gasket due to compression set, dirt, abuse, humidity, vibration, etc. Laboratory methods of measuring gasket effectiveness are not suitable for making such measurements in the field because access to both sides of the gasketed space and the creation of other necessary laboratory conditions may not be possible.

Since the gasket typically is installed between two mating metallic surfaces, a simple DC resistance measurement between the two surfaces may reflect a complete breakdown of the gasket or some other major problem. However, even when part of the gasket may have lost its shielding effectiveness, there may still exist a low resistance current path around the defective part of the gasket such that a DC resistance measurement will erroneously suggest that the gasket effectiveness is satisfactory.

OBJECTS AND BRIEF SUMMARY OF THE INVENTION

It is accordingly an object of the present invention to provide a novel method and system for measuring in the field the shielding effectiveness of an RF gasket installed between two mating metallic surfaces of equipment or structures.

It is a further object of the present invention to provide an effective method and system for accurately determining the shielding effectiveness of an RF gasket in situ without removing the gasket and without removing any part of the structure or equipment.

It is another object of the present invention to provide a novel method and system for providing a measure of RF gasket shielding effectiveness through the creating of a time varying current from one mating surface to another across the gasket and the measurement of the current density through the mating surfaces.

It is a more specific object of the present invention to provide a novel method and system for measuring the current density through two metallic surfaces mated by an RF gasket as an indication of the shielding effectiveness of the RF gasket.

In accordance with the invention the method broadly involves determining the shielding effectiveness of an RF gasket installed between two mating metallic surfaces of equipment or a structure by creating a time varying current flow from one of the mating surfaces to the other across the RF gasket, and sensing the current density of the time varying current in the vicinity of the gasket as a measure of shielding effectiveness.

An apparatus according to the invention includes spaced electrodes placed adjacent respective ones of the two metallic surfaces mated by the RF gasket. The electrodes, preferably copper or other highly conductive metallic discs, are arranged to capacitively couple a signal to the mating metallic surfaces through a dielectric medium between the electrodes and the surfaces. A time varying current is applied across the electrodes and the current density in the mating metallic surfaces is sensed between the electrodes as a measure of gasket shielding effectiveness. If the current density is a maximum this indicates that there is a highly conductive path between the electrodes and the gasket is effective. If the current density is less than the maximum, this indicates that there is a region of poor conductivity between the electrodes and the gasket is less than fully effective.

In accordance with a preferred embodiment of the invention, the electrodes are circular copper discs each with a relatively flat surface and each arranged for placement adjacent and generally parallel to one of the mating metallic surfaces of the equipment or structure. A thin layer of dielectric material is provided on the flat surface of the discs placed adjacent the mating metallic surfaces such that each disc acts as one plate of a capacitor and each of the metallic surfaces acts as the other plate. A pulsed voltages is applied between the two discs and the layers of dielectric material on the discs are placed in contact with the mating metallic surfaces so that the discs are slightly separated from the surfaces. A current density probe is placed above the mating metallic surfaces between the two discs to sense the level of current density in the metallic surfaces. The sensed current density is used as a measure of the gasket shielding effectiveness.

The discs preferably lie in the same plane and are separated by a fixed distance with the current probe mounted approximately midway between the discs. The discs are moved along the surface of the equipment or structure with one disc on each side of the joint between the mating surfaces so that the gasketed joint lies in the space between the discs and the current probe senses current density in the region of the gasket. In this manner, the shielding effectiveness of the gasket along the entirety of the joint between the mating surfaces can be measured by moving the pair of discs along the entire joint and measuring the current density in the region between the discs as the discs are moved. The current density signal from the probe preferably is amplified and digitized so it can be stored and supplied directly to a computer. The current probe output can be calibrated in a laboratory against gaskets of known shielding effectiveness so as to provide a direct measure of gasket shielding effectiveness.

DETAILED DESCRIPTION OF A PREFERRED EMBODIMENT

Figure 1:
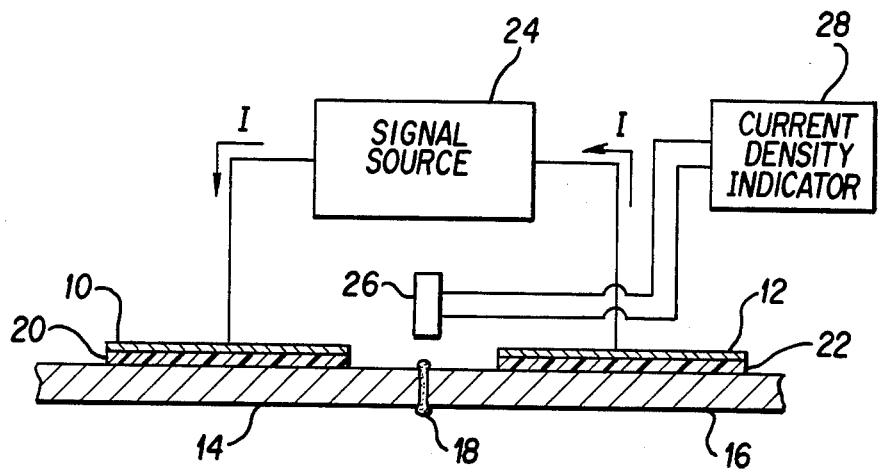
FIG. 1 is a schematic illustration in elevation and partial cross-section of an apparatus according to the present invention for determining the shielding effectiveness of RF gaskets installed between two mating metallic surfaces.

A preferred embodiment of an apparatus for determining the shielding effectiveness of RF gaskets between metallic surfaces is illustrated schematically in FIG. 1. Referring now to FIG. 1, electrodes 10 and 12 are placed adjacent each of two metallic parts with surfaces 14 and 16, respectively, mated by an RF gasket 18. The metallic surfaces 14 and 16 may be, for example, the surfaces of a metal housing for electronic equipment or two surfaces of a metal structure mated by an RF gasket.

The electrodes 10 and 12 preferably are thin copper or other highly conductive metallic discs, circular in shape and spaced from the metallic surfaces 14 and 16 by thin dielectric media 20 and 22. The dielectric medium may be air lying in the gap between each electrode and the underlying mating surfaces, but a dielectric material such as mica or teflon having a high dielectric constant is preferred. The disc 10 and the metallic surface 14 beneath it act as capacitor plates as do the disc 12 and the surface 16, such that a signal may be capacitively coupled from the disc 10 through the metallic surfaces to the disc 12.

A time varying current from a source 24 such as a pulse generator is applied across the discs 10 and 12, and current flows from one disc to the other through the surface beneath the discs by capacitive coupling. The current density between the metallic surfaces is sensed by a current density probe 26 positioned between the discs adjacent the region of the gasket 18 separating the surfaces 14 and 16. As will be described hereinafter in greater detail, the current density sensed by the probe 26 is used as a measure of gasket shielding effectiveness. A maximum current density indicates that there is a highly conductive path between the discs 10 and 12 and therefore the gasket is effective. A current density less than the maximum indicates that there is a region of poor conductivity between the discs 10 and 12 and therefore the gasket is less than fully effective. The current density in the mating surfaces 14 and 16 beneath and between the discs thereby provides a measure of the degree of shielding effectiveness of that portion of the gasket positioned between the discs and beneath the probe 26.

In this regard, the probe 26 preferably is a coil or other inductive probe which can sense time varying current flowing through an area of the mating surfaces between the discs 10 and 12 without electrically contacting the surfaces or the gasket. The sensing range of the probe along the length of the gasket preferably is small compared to the diameters of the discs 10 and 12 so that current density through only a short section of the gasket is sensed at a particular position of the apparatus, thereby providing relatively high resolution. One example of such a current density probe is a Hewlett-Packard HP 547A Current Tracer.

To provide a real time indication of the current density sensed by the probe, the probe 26 may be connected to a suitable meter or other current density indicator 28. In addition or in the alternative, the output signal from the probe 26 may be supplied to a memory or computing device via an analog-to-digital converter as described hereinafter in more detail so that the current density may be recorded and/or analyzed for later presentation and study.

In accordance with a preferred embodiment of the invention, the electrodes are circular copper discs lying in the same plane with a fixed axial spacing. The current probe 26 is mounted in fixed relation to the discs, approximately midway therebetween along a line passing through the centers of the discs. To maintain fixed relative positions of the discs and the current density probe, the components may be mounted in a housing or other suitable structure which may take any suitable form.

In operation, the discs are placed adjacent and generally parallel to the mating metallic surfaces of the gasketed equipment or structure with the gasket in the space between the discs as shown in FIG. 1. The thin layer of dielectric material on the lower surface of each disc may be placed in contact with the metallic surfaces such that the discs are only slightly separated from the surfaces to obtain maximum capacitive coupling between the discs and the metallic surfaces. It will be appreciated that contact between the surfaces 14, 16 and the dielectric 20, 22 not only maximizes capacitive coupling, but also maintains a fixed spacing between the copper discs and the underlying surfaces during measurement.

Electrical pulses are applied between the two discs and the current probe 26, positioned slightly above the surfaces 14 and 16 of the metallic parts approximately midway between the two discs when the discs are in position, senses the level of current flow created in a predetermined portion of the metallic surfaces and across the RF gasket directly beneath it.

The discs 10 and 12 are moved along the surface of the equipment or structure with one disc on each side of the gasket 18 between the mating surfaces 14 and 16 so that the gasketed joint lies in the space between the discs, and the current probe 26 senses current density across continuous portions of the mating surfaces in the region of the gasket 18. In this manner, the shielding effectiveness of the gasket 18 along the entirety of the joint between the mating surfaces can be measured by moving the pair of discs 10 and 12 along the entire joint and measuring the current density in the region between the discs as they are moved.

Figure 2:
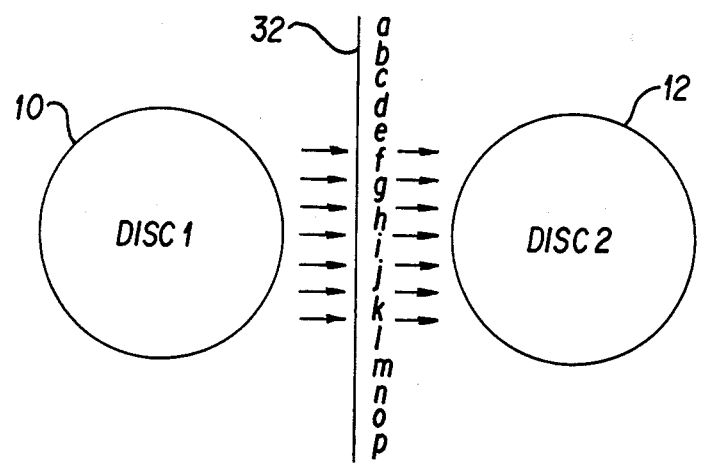
FIG. 2 is a plan view of the discs of FIG. 1 on a continuous metallic surface intended to illustrate a generally uniform, maximum current density between the two spaced discs as would be the best-case condition for a gasket which is totally effective.
Figure 3:
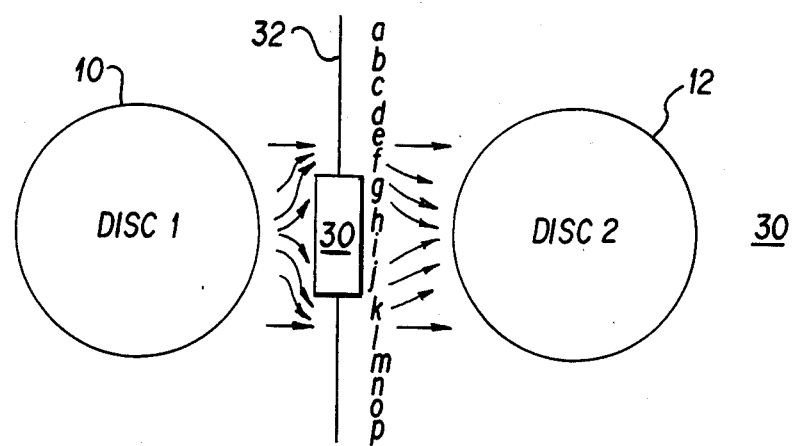
FIG. 3 is a plan view of the discs of FIG. 1 on a discontinuous metallic surface intended to illustrate a nonuniform current density, with a region of zero current density, between the two spaced discs as would be the worse case condition for a gasket with a section which is totally ineffective.

FIGS. 2 and 3 illustrate the discs of FIG. 1 in plan view with exemplary current densities for a gasket of total shielding effectiveness and a gasket with a portion of total shielding and ineffectiveness, respectively. These two conditions are illustrated in FIGS. 2 and 3 by a continuous metallic surface (totally effective shielding, FIG. 2) and by a continuous metallic surface with a discontinuity in the form of a rectangular aperture 30 (an area of totally ineffective shielding, FIG. 3).

It will be appreciated that the current density sensed by the probe 26 between the discs when the discs are positioned on a continuous metallic surface will be a maximum at any point a-p along a line 32 approximately equidistant from each disc as the apparatus is moved along the line 30 as is shown in FIG. 2. On the other hand, the current density across the surface between the discs will vary drastically as the apparatus is moved along this same line 32 if the surface is discontinuous as in FIG. 3.

Figure 4A:
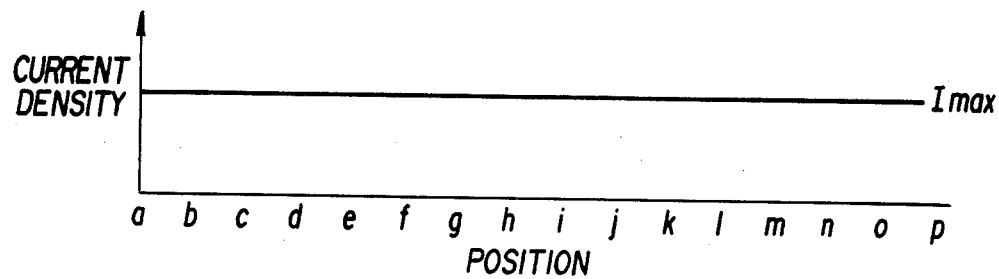
FIGS. 4A and 4B are graphs illustrating current density level versus test point position along a line a-p for the continuous metal surface of FIG. 2 and the discontinuous metal surface of FIG. 3, respectively.
Figure 4B:
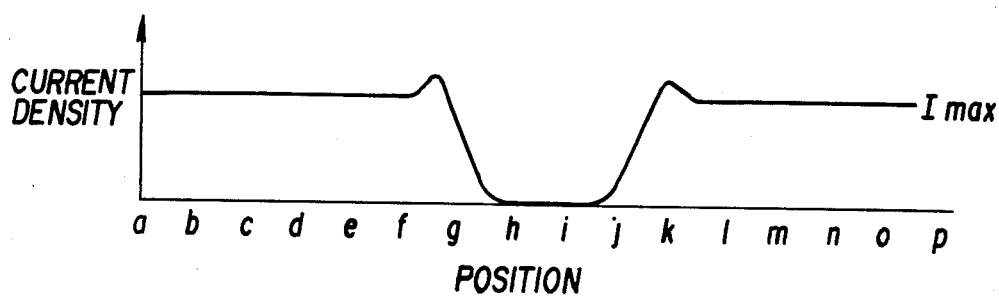

The types of current density readings expected along the line 32 for the continuous and discontinuous conditions of FIGS. 2 and 3, respectively, are illustrated in the graphs of FIGS. 4A and 4B. It can be seen, for example, in FIG. 4A that the current density along the line 32 is a maximum at all points of measurement as the discs and the current probe are moved along the line. This type of result would indicate that a gasket at line 32 would be expected to be totally effective. With the example of FIG. 3, however, there is a discontinuity between points h and j which shows up in the graph of FIG. 4B as a region of minimal current density, indicating a region of ineffective shielding.

As was mentioned previously, the signal source 34 provides a time varying signal that can be capacitively coupled to the surfaces under test. Preferably, the signal source 24 is a pulse generator such as that illustrated in FIG. 5.

Figure 5:
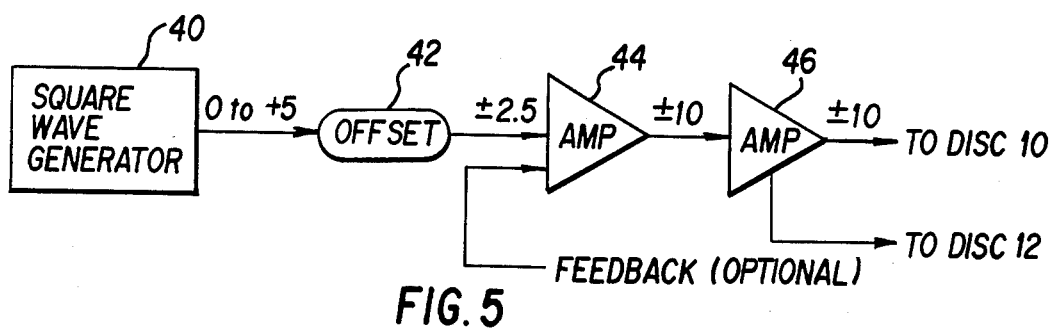
FIG. 5 is a functional block diagram of pulse signal source for driving the discs of FIG. 1; and, FIG. 6 is a functional block diagram of an analog-to-digital converter arrangement for digitizing the output signal from the current probe of the apparatus of FIG. 1.

Referring now to FIG. 5, a conventional square wave generator 40 supplies voltage pulses with excursions from 0 to 5 watts. A conventional d.c. offset circuit 42 offsets the d.c. level of the pulses so that their excursions are from −2.5 volts to 2.5 volts. The offset pulses are supplied to conventional amplifiers 44 and 46 which amplify the pulses and prevent loading of the square wave generator.

In the illustrated embodiment, the amplifier 44 provides amplification with a gain of about four so that the output signal excursions are from −10 to +10 volts. Feedback may be provided for increased stability or gain control. The amplifier 46 has a gain of one and acts as an isolation or buffer amplifier. The output signal from the amplifier 46 is fed directly to the disc 10 of FIG. 1 with the return or common line connected to the disc 12.

The current density signal from the probe 26 preferably is amplified and digitized so it can be stored and supplied directly to a computer. Any suitable conventional A/D converter circuit may be used to digitize the current density probe output signal. An example of a suitable circuit is illustrated in FIG. 6 for a probe which produces an output signal with excursions ranging from −2 to 0.4 volts in response to pulses of the nature produced by the circuit of FIG. 5.

Figure 6:
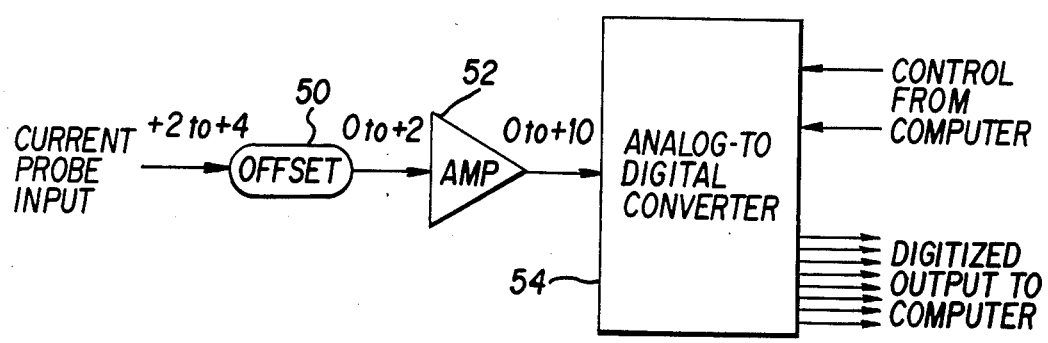

Referring now to FIG. 6, the current density probe output signal is supplied to a conventional d.c. offset circuit 50 essentially to eliminate any d.c. offset and clamp to the probe output signal to ground. the signal from the offset circuit is supplied to a conventional d.c. amplifier 52 with a gain of about four, and the amplified signal is supplied to the analog input terminal of a conventional analog-to-digital (A/D) converter 54. The A/D converter 54 receives necessary control signals (e.g. on sampling clock) from a computer or other controller and provides a digitized output signal (e.g. an 8-bit word). The digital representation of the current density probe output signal may then be stored for later use or may be analyzed by the computer to provide an appropriate display of gasket shielding effectiveness.

It will be appreciated that the current probe output signal can be calibrated in a laboratory against gaskets of known shielding effectiveness so as to provide a direct measure of gasket shielding effectiveness. Thus, for example, a profile of the shielding effectiveness of the gasket under test may be provided through appropriate print-out or other means with removing the gasket or otherwise disturbing the equipment or structure in which the gasket is installed. However, it will be appreciated that an absolute calibration of the probe output signal is not a necessity since the measurement of relative amplitude, with diminishing amplitude indicating a region of poor RF shielding effectiveness, will provide effective results.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method for determining, in situ, the shielding effectiveness of RF gaskets mounted between mating metallic surfaces of equipment or structures comprising the steps of:
   (a) positioning a first electrode adjacent one of the metallic surfaces generally parallel thereto and spaced therefrom and a second electrode adjacent the other of the metallic surfaces generally parallel thereto and spaced therefrom, the first and second electrodes being positioned with a space between the electrodes such that the RF gasket is in the space between the two electrodes and the electrodes are capacitively coupled to the respective surfaces;
   (b) applying a time varying electrical signal between said first and second electrodes;
   (c) moving the electrodes along the surfaces with the gasket between the electrodes; and
   (d) sensing the current density across the surfaces at a predetermined position between the electrodes as a measure of gasket shielding effectiveness.

2. The method of claim 1 wherein step (b) comprises intermittently applying electrical pulses of a predetermined amplitude between said first and second electrodes.

3. The method of claim 1 including the step of: empirically establishing a relationship between the level of the sensed current density and gasket shielding effectiveness; and displaying gasket shielding effectiveness as a function of sensed current density and said established relationship.

4. Apparatus for determining, in situ, the shielding effectiveness of an RF gasket installed between two mating metallic surfaces comprising:
   means for creating a time varying current flow between said mating surfaces across the gasket; and
   means for sensing current density of said time varying current flow between said surfaces in the vicinity of the gasket as a measure of gasket shielding effectiveness,
   wherein said means for creating a time varying current flow comprises a pair of discs with substantially flat upper and lower surfaces lying in substantially the same plane with a fixed spacing between the edges thereof and positionable with the lower surfaces adjacent the two mating surfaces and the gasket in the space between the edges of the discs, and means for applying a time varying electrical signal between said discs.

5. Apparatus for determining, in situ, the shielding effectiveness of an RF gasket installed between two mating metallic surfaces comprising:
   means for creating a time varying current flow between said mating surfaces across the gasket; and
   means for sensing current density of said time varying current flow between said surfaces in the vicinity of the gasket as a measure of gasket shielding effectiveness,
   wherein said means for creating a time varying current flow comprises a first electrically conductive disc positioned adjacent one of the surfaces on one side of the gasket, a second electrically conductive disc positioned adjacent the other of the surfaces on the other side of the gasket, and means for applying a time varying electrical signal between said first and second discs, said discs being spaced from said surfaces by a dielectric medium such that each disc acts as a plate of a capacitor and each surface acts as a plate of a capacitor, the time varying current in the surfaces being created by capacitive coupling.

6. The apparatus of claim 6, wherein each of said discs is a circular metal disc with a layer of dielectric material on a surface of the disc adjacent the mating surface.

7. The apparatus of claim 4, wherein said means for applying a time varying electrical signal comprises a pulse generator for generating a series of electrical pulses.

8. The apparatus of claim 5, wherein said sensing means comprises a current density probe for sensing the current density in said surfaces through inductive coupling.

9. The apparatus of claim 6, wherein said sensing means comprises a current density probe for sensing the current density in said surfaces through inductive coupling.

10. Apparatus for determining the shielding effectiveness of an RF gasket installed between two mating metallic surfaces of equipment or a structure comprising:
    a pair of electrically conductive members each having a relatively flat surface lying in substantially the same plane, the conductive members being separated by a fixed distance to provide a space therebetween;
    a layer of dielectric material on each of the relatively flat surfaces of the conductive members;
    means for applying a time varying electrical signal between the conductive members; and
    a current sensing probe for sensing the flow of time varying current in an underlying surface without contacting such surface, said probe being disposed in the space between the conductive members in fixed relation thereto.

11. The apparatus of claim 10 wherein each of said electrically conductive members is a circular metallic disc.

12. The apparatus of claim 10 wherein said time varying electrical signal is a series of electrical pulses having positive and negative excursions.

* * * * *